United States Patent [19]
Han

[11] Patent Number: 5,759,723
[45] Date of Patent: Jun. 2, 1998

[54] LIGHT EXPOSURE MASK FOR SEMICONDUCTOR DEVICES AND METHOD FOR FORMING THE SAME

[75] Inventor: Jin Su Han, Ichon, Rep. of Korea

[73] Assignee: Hyundai Electronics Industries Co., Ltd., Ichon, Rep. of Korea

[21] Appl. No.: 671,509

[22] Filed: Jun. 27, 1996

[30] Foreign Application Priority Data

Jun. 30, 1995 [KR] Rep. of Korea ............... 1995 18860

[51] Int. Cl.⁶ .................................................. G03F 9/00
[52] U.S. Cl. .................................. 430/5; 430/322
[58] Field of Search .......................... 430/5, 322, 323, 430/324; 156/643; 432/229

[56] References Cited

U.S. PATENT DOCUMENTS

| | | | |
|---|---|---|---|
| 4,936,951 | 6/1990 | Hashimoto et al. | 156/643 |
| 5,057,462 | 10/1991 | Eisenberg et al. | 432/229 |
| 5,585,210 | 12/1996 | Lee et al. | 430/5 |
| 5,605,775 | 2/1997 | Watanabe | 430/5 |

*Primary Examiner*—S. Rosasco
*Attorney, Agent, or Firm*—Gary M. Nath; Nath & Associates

[57] ABSTRACT

A light exposure mask which is used in the formation of a micro pattern, including a transparent substrate, a chromium pattern formed on the transparent substrate, and assistant patterns formed on portions of the chromium pattern where a rounding effect is generated. By virtue of the assistant patterns, it is possible to prevent the phenomenon that the pattern is reduced in size due to the rounding effect. Accordingly, it is possible to accurately form a pattern having a desirable size. Each assistant pattern has a bar, inverted-triangular or inverted-U shape.

20 Claims, 3 Drawing Sheets

5,759,723

LIGHT EXPOSURE MASK FOR SEMICONDUCTOR DEVICES AND METHOD FOR FORMING THE SAME

BACKGROUND OF THE INVENTION

1. Field of the Invention

The present invention relates to a light exposure mask for semiconductor devices and a method for fabricating the same, and more particularly, to a light exposure mask with a mask pattern having a high accuracy, capable of being used in the formation of micro patterns of highly integrated semiconductor devices, and a method for forming such a light exposure mask.

2. Description of the Prior Art

In the fabrication of a highly integrated semiconductor device, a pattern is typically formed on a semiconductor substrate in accordance with a light-exposing etching method which has recently been developed. In this case however, the pattern has a reduced width as the integration of the semiconductor device increases. When a pattern has a convex or concave structure, a rounding effect is generated due to the refraction, scattering and interference of light when a light exposure process is carried out.

Due to such a rounding effect, the pattern may have a length non-uniformly varying in accordance with its width. As a result, the production yield and operating characteristic of semiconductor devices are degraded.

Even when other methods such as X-ray spectrography or the E-beam patterning method, which have not been practically used yet, are used to form desired patterns, a rounding effect may also be generated which involves the same problematic results as those in the light-exposing etching method.

In this regard, it is very important to reduce or eliminate the rounding effect in the fabrication of semiconductor devices.

FIGS. 1A and 1B are layout views, respectively illustrating a conventional method for forming a light exposure mask which is used to form a micro pattern of a semiconductor device.

In accordance with this method, a chromium pattern 2 is formed on a quartz substrate 1, to form a light exposure mask, as shown in FIG. 1A. In the illustrated case, the chromium pattern 2 is provided with a convex structure having different widths.

Using the light exposure mask, a photoresist film pattern 4 is then formed on a semiconductor substrate 5 in accordance with light exposure and the development process, as shown in FIG. 1B.

In this case, a rounding effect is generated which non-uniformly varies the length of the pattern in accordance with the width of the convex structure of the light exposure mask. As a result, the photoresist film pattern 4 is reduced in length as indicated by areas 5. Referring to FIG. 1B, it can be found that the size of the reduced pattern area 5 is higher at the pattern portion having a larger width.

FIGS. 2A and 2B are layout views, respectively illustrating the formation of a light exposure mask having a convex pattern with a uniform micro line width, in accordance with the above-mentioned conventional method.

In this case as shown in FIG. 2A, a light exposure mask having a convex pattern with a micro line width corresponding to that of FIG. 1B generating the highest rounding effect is formed. The formation of the light exposure mask is achieved by forming a chromium pattern 12 on a quartz substrate 11.

Using the light exposure task, a photoresist film pattern 14 is then formed on a semiconductor substrate 13 in accordance with the light exposure and development process, as shown in FIG. 2B.

In this case, the photoresist film pattern 14 is reduced in length as indicated by areas 15.

When such a light exposure mask having the above-mentioned convex pattern is used in the fabrication of semiconductor devices such as transistors, the characteristics of those transistors may vary, due to variation in size of the pattern. As a result, the operating characteristics of the semiconductor devices are degraded.

FIGS. 3A and 3B are layout views respectively illustrating the formation of another light exposure mask having a concave pattern with a uniform micro line width in accordance with the above-mentioned conventional method.

In this case, a light exposure mask having a concave pattern with a micro line width generating a high rounding effect is formed, as shown in FIG. 3A. The formation of the light exposure mask is achieved by forming a chromium pattern 22 on a quartz substrate 21.

Using the light exposure mask, a photoresist film pattern 24 is then formed on a semiconductor substrate 23 in accordance with the light exposure and development process, as shown in FIG. 3B.

In this case, the photoresist film pattern 24 is reduced in length, as indicated by areas 25. That is, the photoresist film pattern 24 formed using the light exposure mask according to the method of FIG. 3A, involves a pattern reducing phenomenon similar to that in the case of FIG. 2B, except that it has an inverted shape from that of FIG. 2B.

As apparent from the above description, the conventional method involves a rounding effect which generates a pattern reducing phenomenon in the formation of highly integrated semiconductor devices. As a result, it is difficult to form a pattern with a desirable size. This conventional method causes the reliability and production yield of semiconductor devices to be degraded. Consequently, the conventional method for forming the light exposure mask, and the light exposure mask formed according to the prior art are not suitable for the fabrication of highly-integrated semiconductor devices.

SUMMARY OF THE INVENTION

Therefore, an object of the invention is to solve the above-mentioned problems involved in the prior art, and to provide a light exposure mask for semiconductor devices capable of preventing a rounding effect from being generated upon carrying out the light exposure and development processes, thereby forming a desired pattern, and a method for forming the light exposure mask.

Another object of the invention is to provide a light exposure mask for semiconductor devices capable of achieving an improvement in the reliability and production yield of semiconductor devices, and a method for forming the light exposure mask.

Another object of the invention is to provide a light exposure mask which is suitable for the fabrication of highly integrated semiconductor devices, and a method for forming the light exposure mask.

In accordance with one aspect, the present invention provides a light exposure mask which is used in the formation of a micro pattern, comprising: a transparent substrate; a light shielding film pattern formed on the transparent substrate; and assistant patterns formed on portions of the light shielding film pattern where a rounding effect is generated.

In accordance with another aspect of the present invention, a method for forming a light exposure mask which is used in the formation of a micro pattern, comprises the steps of: preparing a transparent substrate; forming a light shielding film pattern on the transparent substrate; and forming assistant patterns on portions of the light shielding film pattern where a rounding effect is generated.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
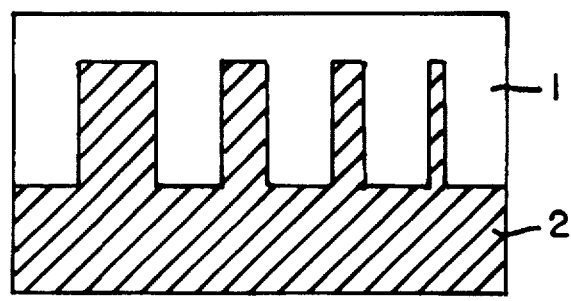
FIGS. 1A and 1B are layout views, respectively illustrating a conventional method for forming a light exposure mask and forming a micro pattern of a semiconductor device using the light exposure mask.
Figure 1B:
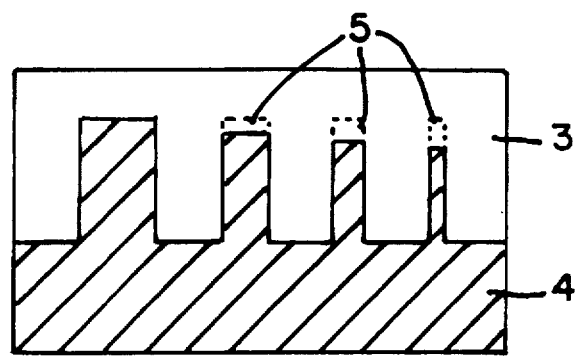
Figure 2A:
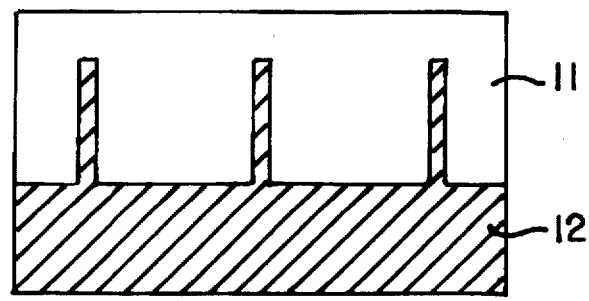
FIGS. 2A and 2B are layout views, respectively illustrating the formation of a light exposure mask having a pattern provided with convex structure, and the formation of a micro pattern of a semiconductor device using the light exposure mask in accordance with the above-mentioned conventional method.
Figure 2B:
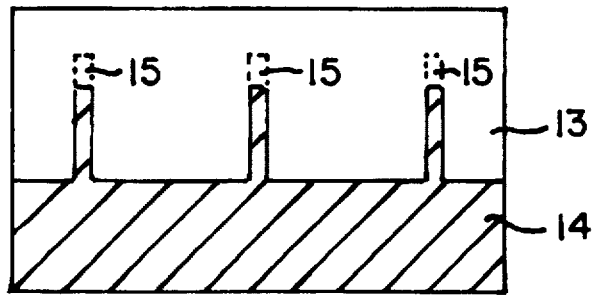
Figure 3A:
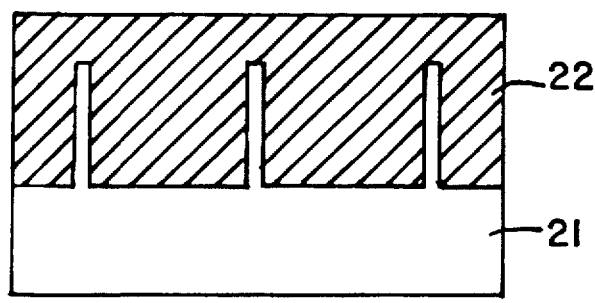
FIGS. 3A and 3B are layout views respectively illustrating the formation of a light exposure mask having a pattern provided with concave structures, and the formation of a micro pattern of a semiconductor device using the light exposure mask in accordance with the above-mentioned conventional method.
Figure 3B:
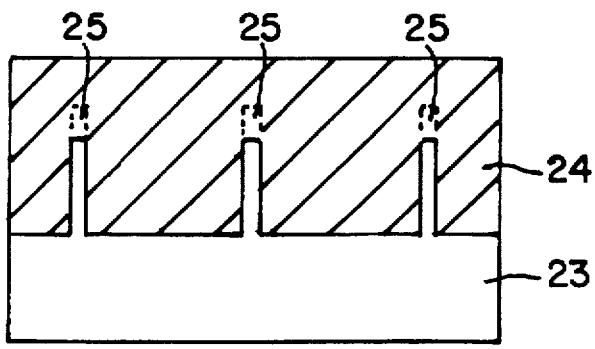
Figure 4A:
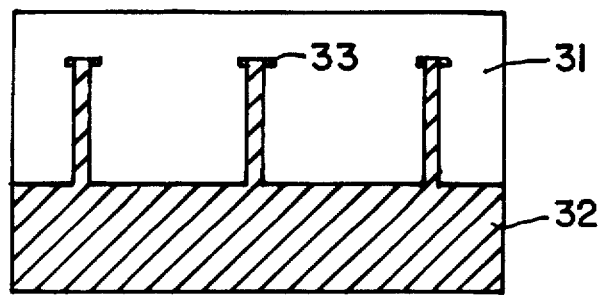
FIGS. 4A and 4B are layout views, respectively illustrating the formation of a light exposure mask and the formation of a micro pattern of a semiconductor device in accordance with the first embodiment of the present invention.
Figure 4B:
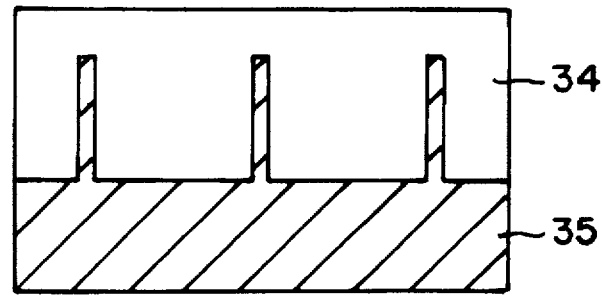

FIGS. 4A and 4B are layout views, respectively illustrating the formation of a light exposure mask and the formation of a micro pattern of a semiconductor device in accordance with a first embodiment of the present invention.

As shown in FIG. 4A, the light exposure mask is provided with a pattern having convex structures with a micro line width. The light exposure mask includes a quartz substrate 31 and a chromium pattern 32 formed on the quartz substrate 31. The formation of the chromium pattern 32 is achieved by forming a photoresist film (not shown) over the entire upper surface of the quartz substrate 31, exposing the photoresist film to programmed electronic beams, and then developing the photoresist film.

The chromium pattern 32 may be formed in accordance with the X-ray spectrography.

The light exposure mask also includes assistant patterns 33. The assistant patterns 33 are formed at portions of the chromium pattern 32 where a rounding effect is generated. Each assistant pattern 33 is shaped into a bar which is orthogonal to the chromium pattern 32.

FIG. 4B shows a photoresist film pattern 35 formed on a semiconductor substrate 34 using a light exposure mask having the above-mentioned structure, in accordance with the light-exposing and developing process.

Referring to FIG. 4B, it can be found that there is no phenomenon in which the pattern is reduced in size due to a rounding effect which is involved in the conventional method.

Figure 5:
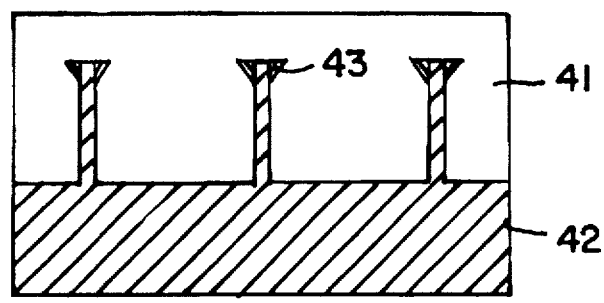
FIG. 5 is a layout view illustrating a light exposure mask which is used to form a micro pattern of a semiconductor device in accordance with a second embodiment of the present invention.
Figure 6:
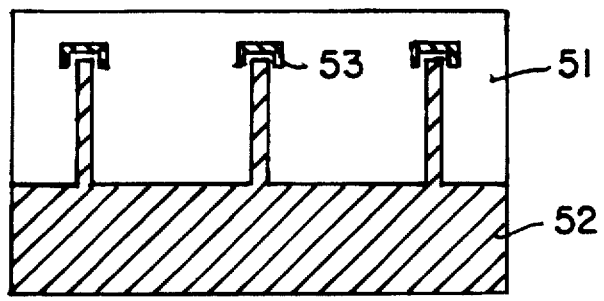
FIG. 6 is a layout view illustrating a light exposure mask which is used to form a micro pattern of a semiconductor device in accordance with a third embodiment of the present invention.

FIGS. 5 and 6 are layout views, respectively illustrating light exposure masks according to the second and third embodiments of the present invention. The light exposure masks of FIGS. 5 and 6 are different from the light exposure mask of FIG. 4A in that the shape of their assistant patterns is different from that of FIG. 4A.

In accordance with the embodiment of FIG. 5, a chromium pattern 42 is formed as a light shielding film on a quartz substrate 41. Assistant patterns 43 are also formed on portions of the chromium pattern 42, where a rounding effect is generated. Each assistant pattern 43 has an inverted-triangular shape.

The formation of the chromium pattern 42 is achieved by forming a photoresist film (not shown) over the entire upper surface of the quartz substrate 41, exposing the photoresist film to programmed electronic beams and then developing the photoresist film. The chromium pattern 42 may be formed in accordance with the X-ray spectrography.

As in the first embodiment, this second embodiment does not involve the phenomenon in that the pattern is reduced in size due to a rounding effect which is involved in the conventional method.

In accordance with the embodiment of FIG. 6, a chromium pattern 52 is formed as a light shielding film on a quartz substrate 51. Assistant patterns 53 are also formed on portions of the chromium pattern 52 where a rounding effect is generated. Each assistant pattern 53 has an inverted-U shape.

As in the first embodiment, the formation of the chromium pattern 52 is achieved by forming a photoresist film (not shown) over the entire upper surface of the quartz substrate 51, exposing the photoresist film to program electronic beams, and then, develop the photoresist film. The chromium pattern 52 may be formed in accordance with the X-ray spectrography.

As in the first embodiment, this embodiment does not involve the phenomenon that the pattern is reduced in size due to a rounding effect which is involved in the conventional method.

Figure 7A:
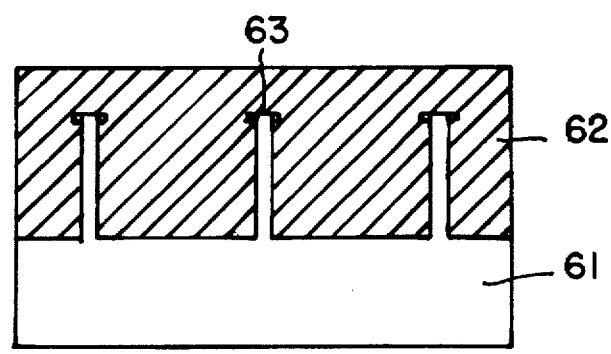
FIGS. 7A and 7B are layout views, respectively illustrating the formation of a light exposure mask and the formation of a micro pattern of a semiconductor device in accordance with a fourth embodiment of the present invention.
Figure 7B:
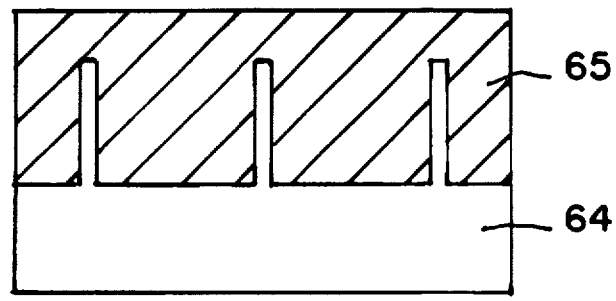

On the other hand, FIGS. 7A and 7B are layout views, respectively illustrating the formation of a light exposure mask and the formation of a micro pattern of a semiconductor device, in accordance with a fourth embodiment of the present invention.

As shown in FIG. 7A, the light exposure mask is provided with a pattern having recesses with a micro line width. The light exposure mask includes a quartz substrate 61 and a chromium pattern 62, formed on the quartz substrate 61.

The light exposure mask also includes assistant patterns 63. The assistant patterns 63 are formed at portions of the chromium pattern 62 where a rounding effect is generated.

FIG. 7B shows a photoresist film pattern 65, formed on a semiconductor substrate 64, using a light exposure mask having the above-mentioned structure, in accordance with the light-exposing and developing process.

Referring to FIG. 7B, it can be found that there is no phenomenon in which the pattern is reduced in size due to a rounding effect which is involved in the conventional method.

Although each assistant pattern 63 is shown as having a bar shape, it may have an inverted-triangular or inverted-U shape.

As apparent from the above description, the present invention provides a light exposure mask including assistant patterns formed at portions of the light exposure mask where a rounding effect is generated, thereby being capable of preventing the phenomenon that the pattern is reduced in size due to the rounding effect. Accordingly, it is possible to accurately form a pattern having a desired size.

Since the light exposure mask of the present invention prevents the phenomenon that the pattern is reduced in size due to the rounding effect, an improvement in the reliability and production yield of semiconductor devices is obtained. Therefore, the light exposure mask of the present invention is suitable for the fabrication of highly integrated semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A light exposure mask that is used in the formation of a micro pattern, comprising:

a transparent substrate;

a light shielding film pattern on said transparent substrate, said pattern having micro lines; and assistant patterns extending across the entire width of said micro lines where a rounding effect is generated.

2. The light exposure mask in accordance with claim 1, wherein said transparent substrate is comprised of a quartz substrate.

3. The light exposure mask in accordance with claim 1, wherein said light shielding film pattern is a chromium pattern.

4. The light exposure mask in accordance with claim 1, wherein said light shielding film pattern has a convex structure.

5. The light exposure mask in accordance with claim 1, wherein said light shielding film pattern has a concave structure.

6. The light exposure mask in accordance with claim 1, wherein each said assistant pattern has a bar shape which is orthogonal to said light shielding film pattern.

7. The light exposure mask in accordance with claim 1, wherein each said assistant pattern has an inverted-triangular shape.

8. The light exposure mask in accordance with claim 1, wherein each said assistant pattern has an inverted-U shape surrounding the corresponding portion of said light shielding film pattern where a rounding effect is generated.

9. A method for forming a light exposure mask which is used in the formation of a micro pattern, comprising the steps of:

preparing a transparent substrate;

forming a light shielding film pattern on said transparent substrate having micro lines; and forming assistant patterns respectively across the entire width of said micro lines where a rounding effect is generated.

10. The method in accordance with claim 9, wherein said transparent substrate is comprised of a quartz substrate.

11. The method in accordance with claim 9, wherein said light shielding film pattern is a chromium pattern.

12. The method in accordance with claim 9, wherein said light shielding film pattern has a convex structure.

13. The method in accordance with claim 9, wherein said light shielding film pattern has a concave structure.

14. The method in accordance with claim 9, wherein each said assistant pattern has a bar shape which is orthogonal to said light shielding film pattern.

15. The method in accordance with claim 9, wherein each said assistant pattern has an inverted-triangular shape.

16. The method in accordance with claim 9, wherein each said assistant pattern has an inverted-U shape surrounding the corresponding portion of said light shielding film pattern where a rounding effect is generated.

17. The method in accordance with claim 9, wherein the step of forming said light shielding film pattern is carried out using a light-exposing etching process.

18. The method in accordance with claim 9, wherein the step of forming said light shielding film pattern is carried out in accordance with light exposure and the development process using electronic beams.

19. The method in accordance with claim 9, wherein the step of forming said light shielding film pattern is carried out in accordance with a light exposure and development process using an X-ray spectrography.

20. A method for forming a micro pattern, comprising the steps of:

preparing a transparent substrate;

forming a light shielding film pattern on said transparent substrate having micro lines;

forming assistant patterns respectively across the entire width of said micro lines, where a rounding effect is generated, thereby forming a light exposure mask;

preparing a semiconductor substrate on which a photoresist film is formed; and patterning said photoresist film in accordance with a light exposure and development process, using said light exposure mask.

* * * * *